(12) United States Patent
Yuan et al.

(10) Patent No.: US 11,777,453 B1
(45) Date of Patent: Oct. 3, 2023

(54) PUBLIC VOLTAGE COMPENSATION METHOD AND DISPLAY PANEL

(71) Applicant: HKC CORPORATION LIMITED, Shenzhen (CN)

(72) Inventors: Zhenghui Yuan, Shenzhen (CN); Baohong Kang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/326,897

(22) Filed: May 31, 2023

(30) Foreign Application Priority Data

Oct. 13, 2022 (CN) .......................... 202211251280.4

(51) Int. Cl.
- *H03F 1/30* (2006.01)
- *H03F 3/45* (2006.01)
- *G09G 3/20* (2006.01)

(52) U.S. Cl.
CPC .............. *H03F 1/302* (2013.01); *G09G 3/20* (2013.01); *H03F 3/4508* (2013.01); *G09G 2300/043* (2013.01); *G09G 2310/0291* (2013.01); *G09G 2320/041* (2013.01); *H03F 2201/3206* (2013.01); *H03F 2203/45181* (2013.01)

(58) Field of Classification Search
CPC ....................................................... G09G 3/20
See application file for complete search history.

(56) References Cited

U.S. PATENT DOCUMENTS

2010/0295476 A1* 11/2010 Franco ................... H05B 47/21
315/297

FOREIGN PATENT DOCUMENTS

| CN | 102842295 A | 12/2012 |
| CN | 112835217 A | 5/2021 |
| CN | 114677985 A | 6/2022 |
| CN | 115035869 A | 9/2022 |
| KR | 20080062481 A | 7/2008 |
| KR | 20080062926 A | 7/2008 |
| KR | 20170008332 A | 1/2017 |

OTHER PUBLICATIONS

First Office Action issued in counterpart Chinese Patent Application No. 202211251280.4, dated Nov. 18, 2022.

* cited by examiner

*Primary Examiner* — Gustavo Polo
(74) *Attorney, Agent, or Firm* — Westbridge IP LLC

(57) ABSTRACT

Disclosed are a public voltage compensation method and a display panel. The public voltage compensation method includes: installing the first multi-channel operational amplifier; connecting the first public voltage feedback output terminal with the first feedback input terminal, connecting the second public voltage feedback output terminal with the second feedback input terminal, connecting the first compensation input terminal with the first compensation output terminal, connecting the third compensation input terminal with the third compensation output terminal, connecting one of the n second compensation input terminals with the second compensation output terminal, and connecting one of the n fourth compensation input terminals with the fourth compensation output terminal; interconnecting each of the n second compensation input terminals and interconnecting each of the n fourth compensation input terminals.

10 Claims, 8 Drawing Sheets

PUBLIC VOLTAGE COMPENSATION METHOD AND DISPLAY PANEL

CROSS-REFERENCE TO RELATED APPLICATIONS

This application claims priority to Chinese Patent Application No. 202211251280.4, filed on Oct. 13, 2022, the entire contents of which are incorporated herein by reference.

TECHNICAL FIELD

The present disclosure relates to the technical field of public voltage compensation, and in particular to a public voltage compensation method and a display module.

BACKGROUND

At present, the display screen of the existing display panel usually has bad display phenomena such as green light, crosstalk, flickering, etc. Therefore, it is necessary to reverse compensate for the public voltage to neutralize the distortion problems caused by the coupling of the public voltage, so as to get better display screen experience. The existing public voltage compensation method adopts a universal compensation method, resulting in a higher device cost.

SUMMARY

The main purpose of the present disclosure is to provide a public voltage compensation method, aiming to solve the problem of the higher device cost in the existing public voltage compensation method.

In order to solve the above objectives, the present disclosure provides a public voltage compensation method. The display module includes a first multi-channel operational amplifier and a display panel. The first multi-channel operational amplifier includes a first feedback input terminal, a second feedback input terminal, a first compensation output terminal, a second compensation output terminal, a third compensation output terminal, and a fourth compensation output terminal. The display panel includes a first side edge, a public electrode wire to be compensated, a first public voltage feedback output terminal, a second public voltage feedback output terminal, a first compensation input terminal, n second compensation input terminals, a third compensation input terminal, and n fourth compensation input terminals. The first compensation input terminal and the n second compensation input terminals are distributed along a direction from a first end of the first side edge to a second end of the first side edge, and the first compensation input terminal is provided at a position corresponding to the first end of the first side edge. The third compensation input terminal and the n fourth compensation input terminals are distributed along a direction from the second end of the first side edge to the first end of the first side edge, and the third compensation input terminal is provided at a position corresponding to the second end of the first side edge. The public voltage compensation method includes:

installing the first multi-channel operational amplifier;
   connecting the first public voltage feedback output terminal of the display panel with the first feedback input terminal of the first multi-channel operational amplifier, connecting the second public voltage feedback output terminal of the display panel with the second feedback input terminal of the first multi-channel operational amplifier, connecting the first compensation input terminal of the display panel with the first compensation output terminal of the first multi-channel operational amplifier, connecting the third compensation input terminal of the display panel with the third compensation output terminal of the first multi-channel operational amplifier, connecting one of the n second compensation input terminals with the second compensation output terminal of the first multi-channel operational amplifier, and connecting one of the n fourth compensation input terminals with the fourth compensation output terminal of the first multi-channel operational amplifier;
   interconnecting each of the n second compensation input terminals and interconnecting each of the n fourth compensation input terminals, to allow the first multi-channel operational amplifier to compensate for the public voltage of the public electrode wire to be compensated; and
   detecting a compensation effect of the public voltage of the public electrode wire to be compensated, and determining whether to end up compensating for the public voltage of the public electrode wire to be compensated according to the compensation effect of the public voltage. The n is greater than 1.

In an embodiment, the detecting the compensation effect of the public voltage of the public electrode wire to be compensated, and determining whether to end up compensating for the public voltage of the public electrode wire to be compensated according to the compensation effect of the public voltage includes:

detecting a display parameter of the display panel when the display panel is displayed, and determining whether the compensation effect of the public voltage reaches a preset effect according to a detected display parameter and a preset display parameter;
   in response to that the compensation effect of the public voltage reaches the preset effect, ending up compensating for the public voltage of the public electrode wire to be compensated; or
   in response to that the compensation effect of the public voltage does not reach the preset effect, installing a second multi-channel operational amplifier, and allowing the second multi-channel operational amplifier to compensate for the public voltage of the public electrode wire to be compensated, to improve the compensation effect of the public voltage of the public electrode wire to be compensated.

In an embodiment, the in response to that the compensation effect of the public voltage reaches the preset effect, ending up compensating for the public voltage of the public electrode wire to be compensated includes:

in response to that the compensation effect of the public voltage reaches the preset effect, detecting a working parameter of the first multi-channel operational amplifier when the display panel is displayed, and determining whether stability of the compensation effect reaches preset stability according to a detected working parameter and a preset working parameter range; and
   in response to that the stability of the compensation effect reaches the preset stability, ending up compensating for the public voltage of the public electrode wire to be compensated.

In an embodiment, the in response to that the compensation effect of the public voltage reaches the preset effect, ending up compensating for the public voltage of the public electrode wire to be compensated further includes:

in response to that the stability of the compensation effect does not reach the preset stability, installing the second multi-channel operational amplifier, and allowing the second multi-channel operational amplifier to compensate for the public voltage of the public electrode wire to be compensated, to improve the stability of the compensation effect.

In an embodiment, the working parameter includes a working temperature.

In an embodiment, the second multi-channel operational amplifier includes a first feedback input terminal, a second feedback input terminal, a first compensation output terminal, a second compensation output terminal, a third compensation output terminal, and a fourth compensation output terminal; and the allowing the second multi-channel operational amplifier to compensate for the public voltage of the public electrode wire to be compensated includes:

disconnecting the interconnection among the n second compensation input terminals, and disconnecting the interconnection among the n fourth compensation input terminals; and connecting the first public voltage feedback output terminal of the display panel with the first feedback input terminal of the second multi-channel operational amplifier, connecting the second public voltage feedback output terminal of the display panel with the second feedback input terminal of the second multi-channel operational amplifier, connecting a second compensation input terminals of n−1 second compensation input terminals in a suspended state with the first compensation output terminal of the second multi-channel operational amplifier, connecting b second compensation input terminals of n−1−a second compensation input terminals in the suspended state with the second compensation output terminal of the second multi-channel operational amplifier, connecting c fourth compensation input terminals of n−1 fourth compensation input terminals in the suspended state with the third compensation output terminal of the second multi-channel operational amplifier, and connecting d fourth compensation input terminals of n−1−c fourth compensation input terminals in the suspended state with the fourth compensation output terminal of the second multi-channel operational amplifier. Each of the a, the b, the c, and the d is not less than 1.

In an embodiment, the interconnecting each of the n second compensation input terminals and interconnecting each of the n fourth compensation input terminals includes:

keeping n−1 first preset devices and n−1 second preset devices in a first state, to make two adjacent second compensation input terminals connected to each other through the first preset device in the first state and make two adjacent fourth compensation input terminals connected to each other through the second preset device in the first state; and the disconnecting each interconnection among the n second compensation input terminals, and disconnecting each interconnection among the n fourth compensation input terminals includes:

keeping n−1 first preset devices and n−1 second preset devices in a second state, to make any one of the n−1 first preset devices disconnect the connection between two adjacent second compensation input terminals which are connected to each other through the first preset device in the first state and make any one of the n−1 second preset devices disconnect the connection between two adjacent fourth compensation input terminals which are connected to each other through the first preset device in the first state, both the first preset device and the second preset device being a zero-ohm resistor or a switching device.

In an embodiment, before the installing the first multi-channel operational amplifier, the public voltage compensation method further includes:

determining whether poor display exists in the display panel, and installing the first multi-channel operational amplifier in response to that the poor display exists in the display panel.

The present disclosure further provides a display module, for implementing the public voltage compensation method as mentioned above.

The display module includes the first multi-channel operational amplifier and the display panel;

the first multi-channel operational amplifier includes the first feedback input terminal, the second feedback input terminal, the first compensation output terminal, the second compensation output terminal, the third compensation output terminal, and the fourth compensation output terminal; and the display panel includes the first side edge, the public electrode wire to be compensated, the first preset installation position, the first public voltage feedback output terminal, the second public voltage feedback output terminal, the first compensation input terminal, n second compensation input terminals, the third compensation input terminal, and n fourth compensation input terminals, the first preset installation position is for the first multi-channel operational amplifier to be installed, the first compensation input terminal and the n second compensation input terminals are distributed along the direction from the first end of the first side edge to the second end of the first side edge, and the first compensation input terminal is provided at a position corresponding to the first end of the first side edge, the third compensation input terminal and the n fourth compensation input terminals are distributed along the direction from the second end of the first side edge to the first end of the first side edge, and the third compensation input terminal is provided at a position corresponding to the second end of the first side edge.

In an embodiment, the display module further includes a second multi-channel operational amplifier including a first feedback input terminal, a second feedback input terminal, a first compensation output terminal, a second compensation output terminal, a third compensation output terminal, and a fourth compensation output terminal. The display panel further includes a second preset installation position for the second multi-channel operational amplifier to be installed.

Technology solutions of the present disclosure provide a public voltage compensation method based on a multi-channel operational amplifier, so that testers can first install the first multi-channel operational amplifier to compensate for the public voltage at the public electrode to be compensated, and can determine whether to end up compensating for the public voltage at the public electrode wire to be compensated according to the compensation effect of the current public voltage. If poor display still exists in the display panel after compensation, disconnecting each interconnection among the n second compensation input terminals, and disconnecting each interconnection among the n fourth compensation input terminals. In this way, the tester can further design the compensation method to avoid remaining poor display. Compared with the existing compensation method, it can be avoided that a plurality of operational amplifier feedback channels are provided at each display panel and the device cost increases, thereby solving the problem of higher device costs of existing public voltage compensation methods.

BRIEF DESCRIPTION OF THE DRAWINGS

To illustrate the technical solutions according to the embodiments of the present disclosure or the related art more clearly, the accompanying drawings for describing the embodiments or the related art are introduced briefly in the following. Apparently, the accompanying drawings in the following description are only some embodiments of the present disclosure. Persons of ordinary skill in the art can derive other drawings from structures of the accompanying drawings without creative efforts.

Figure 1:
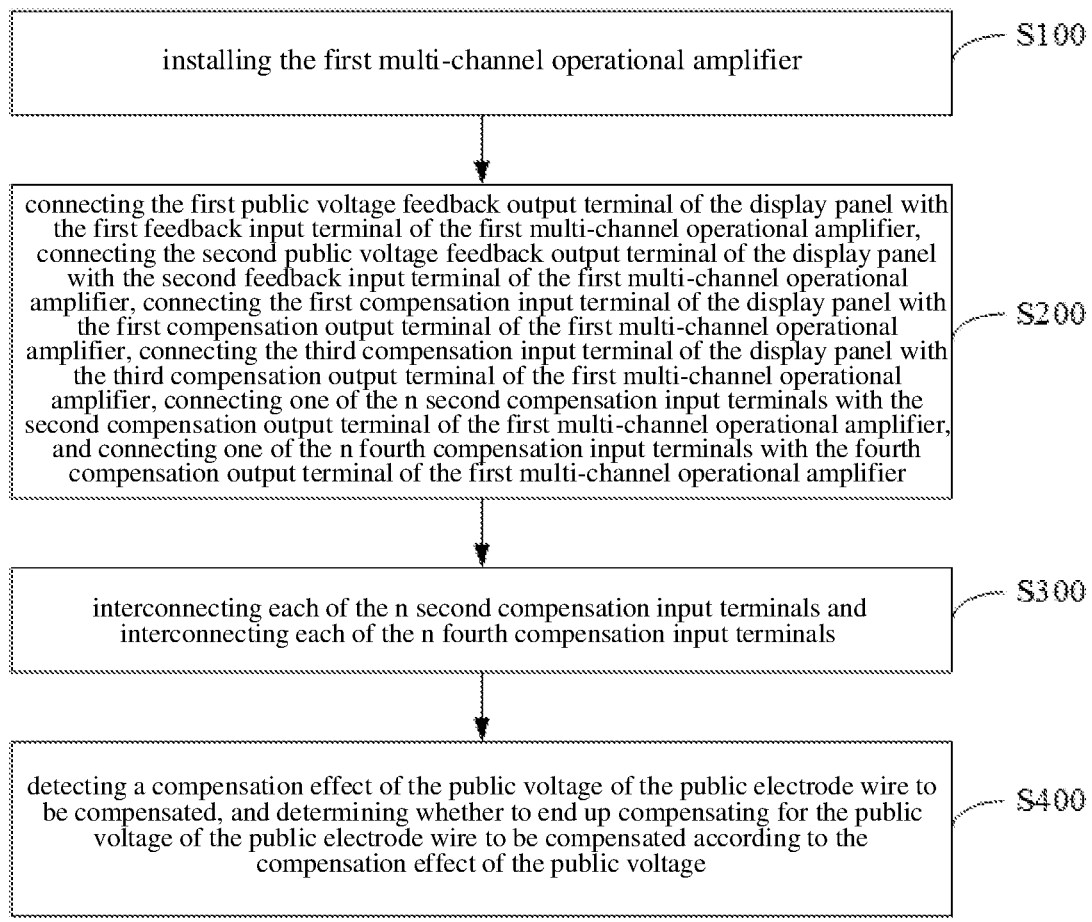
FIG. 1 is a schematic operational diagram of a public voltage compensation method according to a first embodiment of the present disclosure.

The realization of the objective, functional characteristics, and advantages of the present disclosure are further described with reference to the accompanying drawings.

DETAILED DESCRIPTION OF THE EMBODIMENTS

The technical solutions of the embodiments of the present disclosure will be described in more detail below with reference to the accompanying drawings. It is obvious that the embodiments to be described are only some rather than all of the embodiments of the present disclosure. All other embodiments obtained by persons skilled in the art based on the embodiments of the present disclosure without creative efforts shall fall within the scope of the present disclosure.

In addition, the descriptions associated with, e.g., "first" and "second," in the present disclosure are merely for descriptive purposes, and cannot be understood as indicating or suggesting relative importance or impliedly indicating the number of the indicated technical feature. Therefore, the feature associated with "first" or "second" can expressly or impliedly include at least one such feature. In addition, the technical solutions between the various embodiments can be combined with each other, but they must be based on the realization of those of ordinary skill in the art. When the combination of technical solutions is contradictory or cannot be achieved, it should be considered that such a combination of technical solutions does not exist, nor is it within the scope of the present disclosure.

The First Embodiment

The present disclosure provides a public voltage compensation method, applied in a display module.

The display module includes a first multi-channel operational amplifier OP1 and a display panel. The first multi-channel operational amplifier OP1 includes a first feedback input terminal FB1-in, a second feedback input terminal FB2-in, a first compensation output terminal A1, a second compensation output terminal A2, a third compensation output terminal A3, and a fourth compensation output terminal A4. The display panel includes a first side edge, a public electrode wire to be compensated, a first public voltage feedback output terminal FB1-out, a second public voltage feedback output terminal FB2-out, a first compensation input terminal B1, n second compensation input terminals B2, a third compensation input terminal B3, and n fourth compensation input terminals B4. The first compensation input terminal B1 and the n second compensation input terminals B2 are distributed along a direction from a first end of the first side edge to a second end of the first side edge, and the first compensation input terminal B1 is provided at a position corresponding to the first end of the first side edge. The third compensation input terminal B3 and the n fourth compensation input terminals B4 are distributed along a direction from the second end of the first side edge to the first end of the first side edge, and the third compensation input terminal B3 is provided at a position corresponding to the second end of the first side edge. In the actual implementation, the display panel may include a plurality of public electrode wires, and each public electrode wire may receive the public voltage output from the public voltage generating circuit to control the flip effect of the liquid crystal layer in the corresponding row pixel. During the compensation process of the public voltage of the display panel, the testers can first determine at least one public electrode wire as the public electrode wire to be compensated that causes poor display in a plurality of public wires. The display panel may further include two public voltage sampling circuits corresponding to each public electrode wire to be compensated. The two public voltage sampling circuits are used to sample the voltage values at both terminals of the same public electrode wire to be compensated, and the first public voltage feedback output terminal FB1-out and the second public voltage feedback output terminal FB2-out respectively output the corresponding public voltage feedback signals, which will be represented as the first public voltage feedback signal Vcom-FB1 and the second public voltage feedback signal Vcom-FB2 in the following description. The first compensation input terminal B1, the n second compensation input terminals B2, the third compensation input terminal B3, and the n fourth compensation input terminals B4 are used to output the accessed compensation signal to different points of the public electrode wire to be compensated, thereby achieving the compensation for the public voltage of the public electrode wire to be compensated.

At present, the existing public voltage compensation method is a universal method, that is, to directly compensate for the display panel, which not only can avoid most poor display, but also can adapt to most display panels to compensate for the public voltage and detect the compensation effect after the compensation is finished. If no poor display exists in the display panel after compensation, ending up compensating for the public voltage compensation test. If poor display still exists in the display panel after compensation, the original universal compensation method needs to be removed and the display panel needs to be washed. After adjusting the compensation method, reinstalling and verifying the adjusted compensation method. If poor display still exists in the display panel, repeating the above process until no poor display exists in the display panel. For example, since the first compensation input terminal B1 and the third compensation input terminal B3 are placed at the outermost edge, the compensation signal requirements of the first compensation input terminal B1 and the third compensation input terminal B3 are great. In the existing compensation methods, a separate operational amplifier feedback channel is used to output compensation signals required by the first compensation input terminal B1 and the third compensation input terminal B3. Further, each of n remaining second compensation input terminals B2 and n remaining fourth compensation input terminal B4 respectively uses an operational amplifier feedback channel. In this way, each the public electrode wire to be tested needs to use at least four operational amplifier feedback channels, resulting in the higher device cost.

Figure 4:
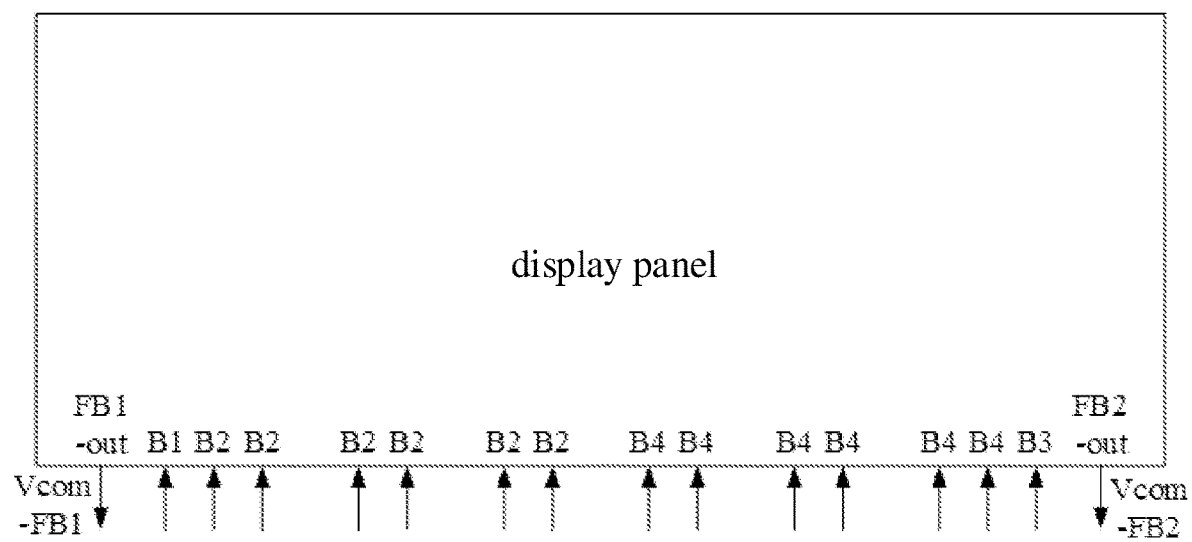
FIG. 4 is a schematic structural diagram of a display panel in a display module according to a second embodiment of the present disclosure.
Figure 5:
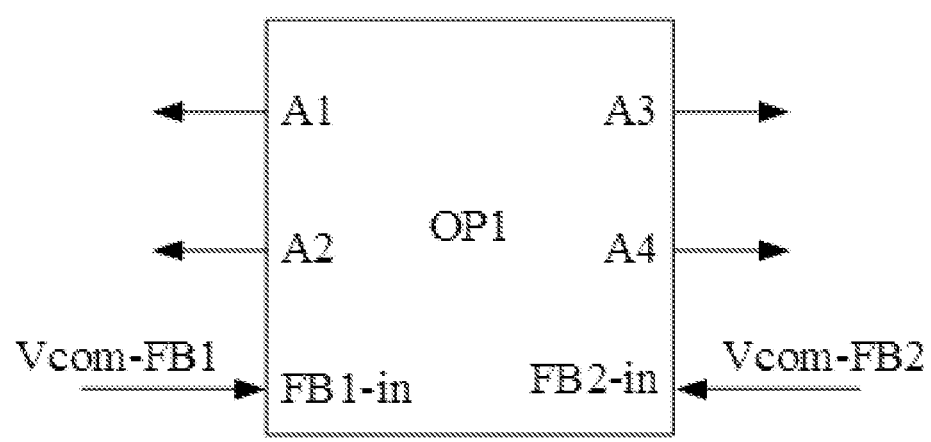
FIG. 5 is a schematic structural diagram of a first multi-channel operational amplifier in the display module according to the second embodiment of the present disclosure.

For the above problems, as shown in FIG. 1, FIG. 4, and FIG. 5, in the first embodiment, the public voltage compensation method includes following operations.

Operation S100, installing the first multi-channel operational amplifier OP1.

Operation S200, connecting the first public voltage feedback output terminal FB1-out of the display panel with the first feedback input terminal FB1-in of the first multi-channel operational amplifier OP1, connecting the second public voltage feedback output terminal FB2-out of the display panel with the second feedback input terminal FB2-in of the first multi-channel operational amplifier OP1, connecting the first compensation input terminal B1 of the display panel with the first compensation output terminal A1 of the first multi-channel operational amplifier OP1, connecting the third compensation input terminal B3 of the display panel with the third compensation output terminal A3 of the first multi-channel operational amplifier OP1, connecting one of the n second compensation input terminals B2 with the second compensation output terminal A2 of the first multi-channel operational amplifier OP1, and connecting one of the n fourth compensation input terminals B4 with the fourth compensation output terminal A4 of the first multi-channel operational amplifier OP1.

In this embodiment, testers can install the first multi-channel operational amplifier at the circuit board by welding. Based on traces on the circuit board, the first public voltage feedback output terminal FB1-out of the display panel can be connected to the first feedback input terminal FB1-in of the first multi-channel operational amplifier OP1, and the second public voltage feedback output terminal FB2-out of the display panel can be connected to the second feedback input terminal FB2-in of the first multi-channel operational amplifier OP1. Further, the first compensation input terminal B1 of the display panel can be connected to the first compensation output terminal A1 of the first multi-channel operational amplifier OP1, and the third compensation input terminal B3 of the display panel can be connected to the third compensation output terminal A3 of the first multi-channel operational amplifier OP1.

When realizing display, the display area corresponding to the public electrode wire can be divided into the first display area and the second display area reference to the vertical bisector of the first side edge. The n second compensation input terminals B2 and the n fourth compensation input terminals B4 are symmetrically distributed reference to the vertical bisector of the first side edge. According to the appearance positions of poor display existing in the first display area and/or the second display area, testers can respectively choose a second compensation input terminal B2 and a fourth compensation input terminal B4 corresponding to the appearance positions from the n second compensation input terminals B2 and the n fourth compensation input terminals B4. According to the corresponding traces on the circuit board, the chosen second compensation input terminal B2 can be connected to the second compensation output terminal A2, and the chosen fourth compensation input terminal B4 can be connected to the fourth compensation output terminal A4. It should be noted that, the chosen second compensation input terminal B2 and the fourth compensation input terminal B4 may be symmetrically distributed reference to the vertical bisector of the first side edge, or may not, which will not be limited herein. For example, when poor display exists in the first display area and the second display area, testers can choose the first second compensation input terminal B2 of the n second compensation input terminals B2, and choose the first fourth compensation input terminal B4 of the n fourth compensation input terminals B4. That is, choosing a second compensation input terminal B2 closest to the first compensation input terminal B1 and a fourth compensation input terminal B4 closest to the third compensation input terminal B3. In this case, the chosen second compensation input terminals B2 and the fourth compensation input terminal B4 are symmetrically distributed reference to the vertical bisector of the first side edge.

Operation S300, interconnecting each of the n second compensation input terminals B2 and interconnecting each of the n fourth compensation input terminals B4, to allow the first multi-channel operational amplifier OP1 to compensate for the public voltage of the public electrode wire to be compensated.

In this case, only one of the n second compensation input terminals B2 is in connection, and the remaining n−1 second compensation input terminals B2 are suspended. Based on the traces on the circuit board, testers can connect two adjacent second compensation input terminals B2. Or a zero-ohm resistor can be provided between each two adjacent second compensation input terminals B2, and both terminals of the zero-ohm resistor are respectively connected to the second compensation input terminals B2 on both sides. Or a switching device T can be provided between each two adjacent second compensation input terminals B2, and the input terminal and the output terminal of the switching device T are respectively connected to the second compensation input terminals B2 on both sides. Through turning on the switch device T, the interconnection among the n second compensation input terminals B2 can be achieved.

Only one of the n fourth compensation input terminals B4 is in connection, and the remaining n−1 fourth compensation input terminals B4 are suspended. Based on the traces on the circuit board, testers can connect two adjacent fourth compensation input terminals B4. Or a zero-ohm resistor can be provided between each two adjacent fourth compensation input terminals B4, and both terminals of the zero-ohm resistor are respectively connected to the fourth compensation input terminals B4 on both sides. Or a switching device T can be provided between each two adjacent fourth compensation input terminals B4, and the input terminal and the output terminal of the switching device T are respectively connected to the fourth compensation input terminals B4 on both sides. Through turning on the switch device T, the interconnection among the n fourth compensation input terminals B4 can be achieved.

Operation S400, detecting a compensation effect of the public voltage of the display panel, and determining whether to end up compensating for the public voltage of the display panel according to the compensation effect of the public voltage.

N is greater than 1.

Figure 6:
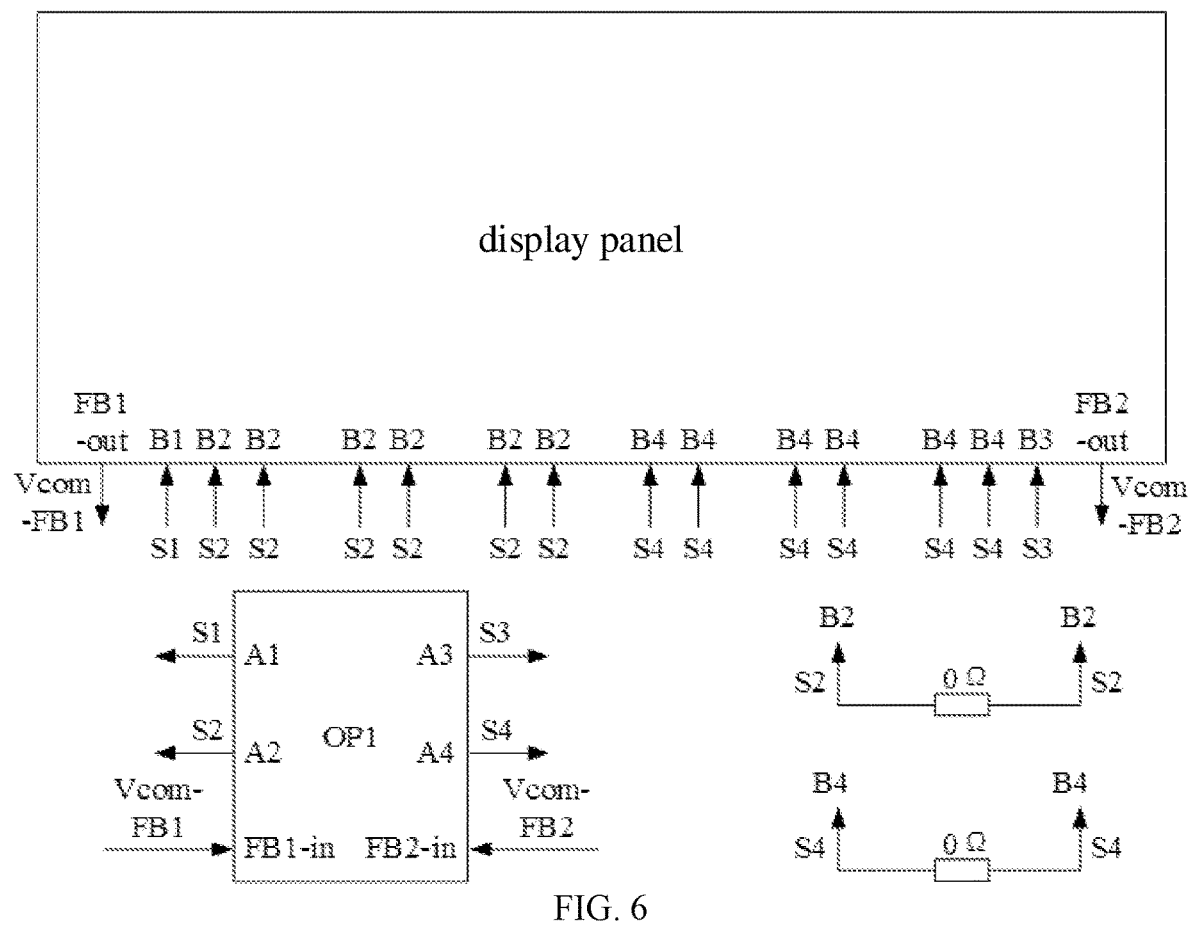
FIG. 6 is a circuit schematic diagram of the display module after the display module adopts the public voltage compensation method of the first embodiment according to the second embodiment of the present disclosure.

After performing operation S300, the tester can control display in the display panel. It can be understood that, when the display panel is displayed, according to the first public voltage feedback signal Vcom-FB1 received by the first multi-channel operational amplifier OP1, the first compensation output terminal A1 may output the first compensation signal S1 to the first compensation input terminal B1, and the second compensation output terminal A2 may output the second compensation signal S2 to the n second compensation input terminals B2. Further, according to the second public voltage feedback signal Vcom-FB2 received by the first multi-channel operational amplifier OP1, the third compensation output terminal A3 may output the third compensation signal S3 to the third compensation input terminal B3, and the fourth compensation output terminal A4 may output the fourth compensation signal S4 to the n fourth compensation input terminals B4. In this way, as shown in FIG. 6, the public electrode wire can compensate for the public voltage according to the first compensation signal S1, then second compensation signals S2, the third compensation signal S3, and the n fourth compensation signals S4 received by the public electrode wire. Testers can determine whether the compensation effect of the public voltage at the public electrode wire reaches the preset effect according to the display effect after compensation. If the compensation effect reaches the preset effect, it can be determined that the compensation for the public voltage at the public electrode wire is finished. The aforementioned operation is repeated until the compensation for the public voltage at each public electrode wire is finished, then the compensation process of the public voltage in the display panel can be ended up.

Technology solutions of the present disclosure provide a public voltage compensation method based on a multi-channel operational amplifier, so that testers can first install the first multi-channel operational amplifier OP1 to compensate for the public voltage at the public electrode to be compensated, and can determine whether to end up compensating for the public voltage at the public electrode wire to be compensated according to the compensation effect of the current public voltage. If poor display still exists in the display panel after compensation, disconnecting each interconnection among the n second compensation input terminals B2, and disconnecting each interconnection among the n fourth compensation input terminals B4. In this way, the tester can further design the compensation method to avoid remaining poor display. Compared with the existing compensation method, it can be avoided that a plurality of operational amplifier feedback channels are provided at each display panel and the device cost increases, thereby solving the problem of higher device costs of existing public voltage compensation methods.

Figure 2:
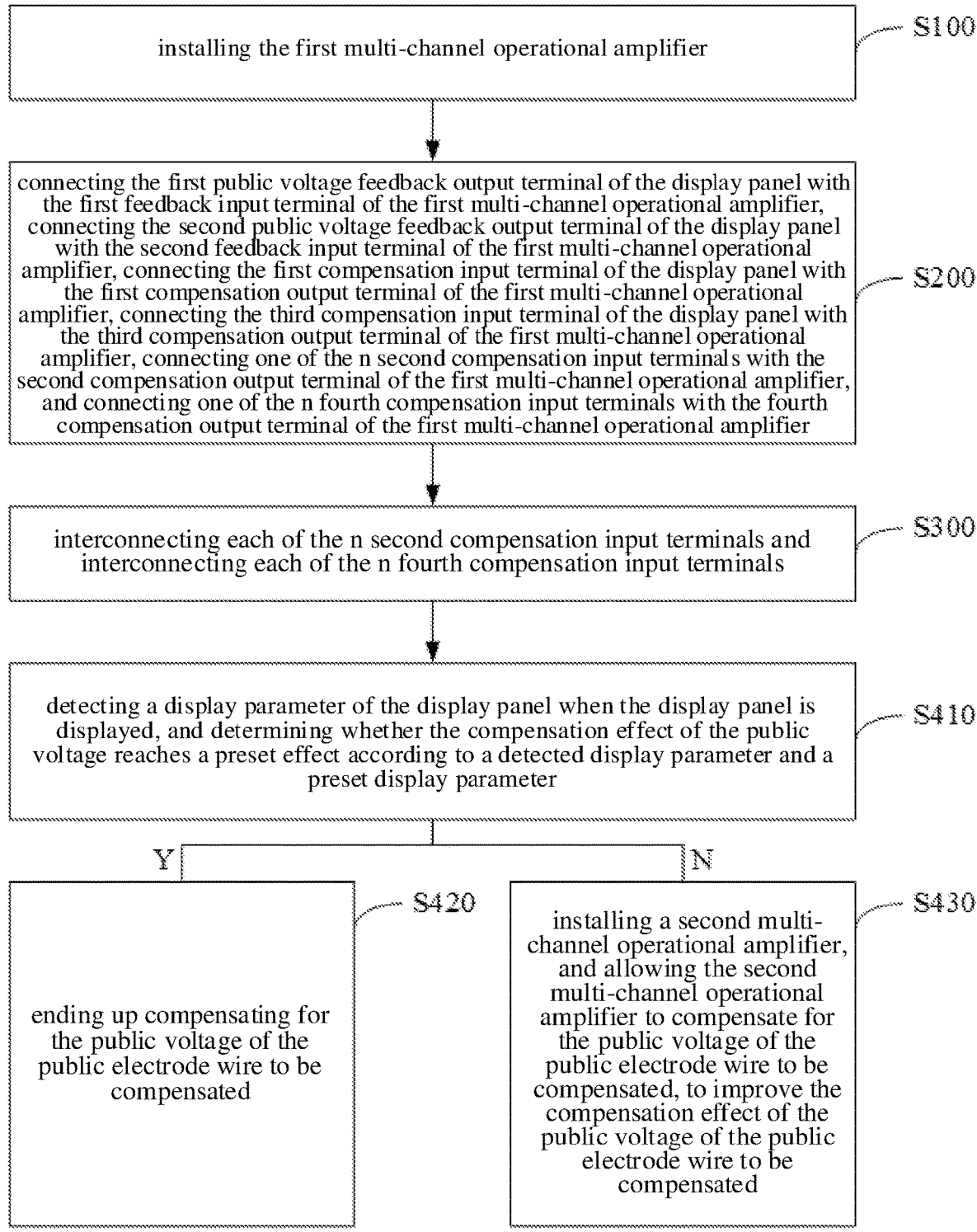
FIG. 2 is another schematic operational diagram of the public voltage compensation method according to the first embodiment of the present disclosure.

As shown in FIG. 2, in the first embodiment, the operation S400, detecting the compensation effect of the public voltage of the public electrode wire to be compensated, and determining whether to end up compensating for the public voltage of the public electrode wire to be compensated according to the compensation effect of the public voltage includes following operations.

Operation S410, detecting a display parameter of the display panel when the display panel is displayed, and determining whether the compensation effect of the public voltage reaches a preset effect according to a detected display parameter and a preset display parameter.

Operation S420, in response to that the compensation effect of the public voltage reaches the preset effect, ending up compensating for the public voltage of the public electrode wire to be compensated.

Operation S430, in response to that the compensation effect of the public voltage does not reach the preset effect, installing a second multi-channel operational amplifier OP2, and allowing the second multi-channel operational amplifier OP2 to compensate for the public voltage of the public electrode wire to be compensated, to improve the compensation effect of the public voltage of the public electrode wire to be compensated.

In this embodiment, the display parameter can be determined according to the poor display. The display parameter can be the display gray scale or the display screen. Correspondingly, the preset display parameters can be the preset display gray scale or the preset display screen with standard effect. Testers can obtain the display parameter by a professional instrument or only by eyes when the display panel is displayed, and can compare the display parameter with the preset display parameters, then can determine whether the parameter error of the display parameter and the preset display parameter is in an acceptable preset error range. When the parameter error is in an acceptable preset error range, determining that the compensation effect of the public voltage reaches the preset effect, and ending up compensating for the public voltage of the public electrode wire to be compensated. When the parameter error is not in an acceptable preset error range, that is, the parameter error is out of the acceptable preset error range, determining that the compensation effect of the public voltage at the first multi-channel operational amplifier OP1 does not reach the preset effect. In this case, testers can install the second multi-channel operational amplifier OP2, and can design compensation methods to form a public voltage compensation circuit between the second multi-channel operational amplifier OP2 and the public electrode wire to be tested, so that the first multi-channel operational amplifier OP1 and the second multi-channel operational amplifier OP2 can cooperate to compensate for the public voltage of the public electrode wire to be compensated, thereby improving the compensation effect of the public voltage of the public electrode wire to be compensated.

Figure 3:
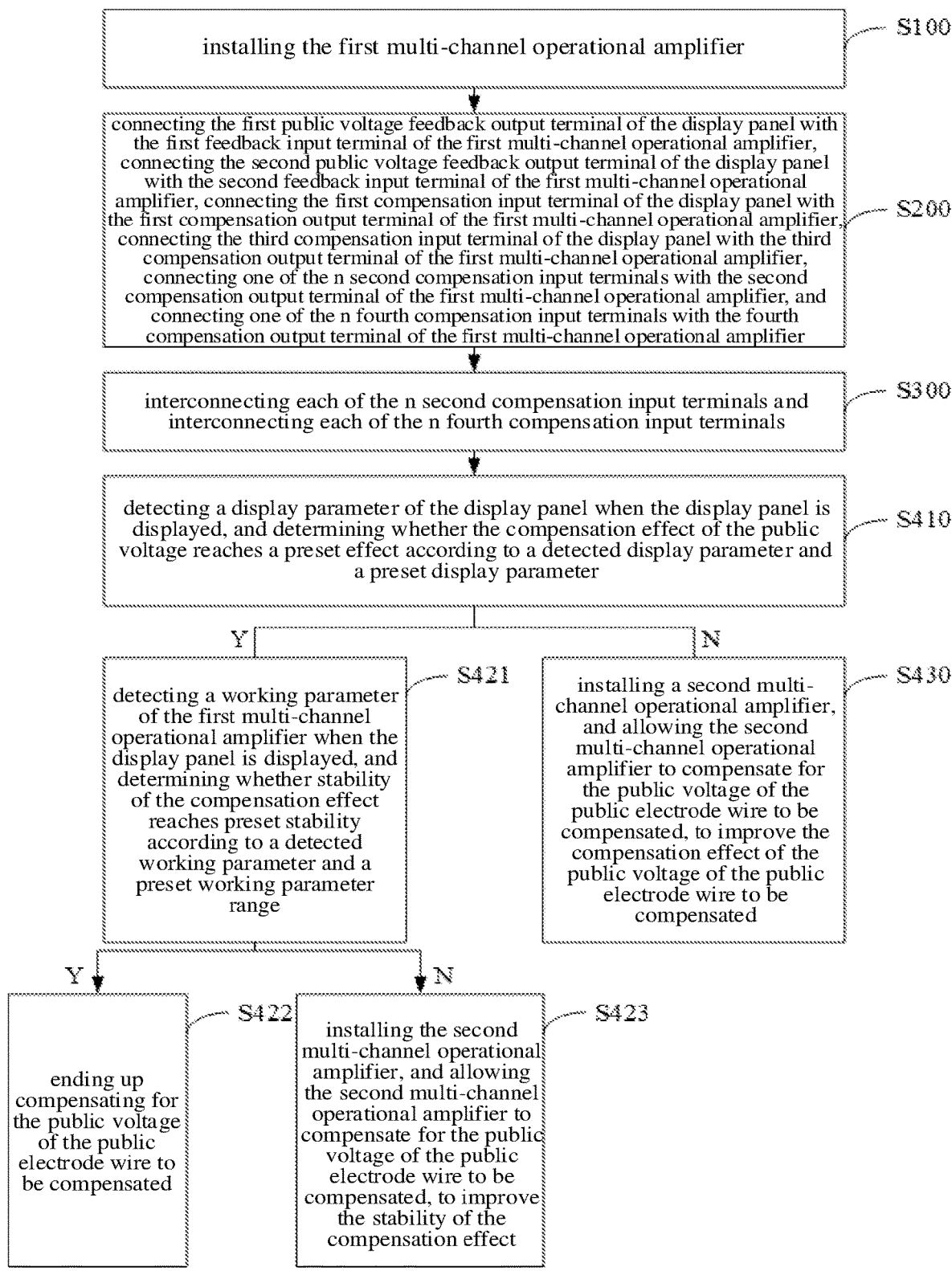
FIG. 3 is yet another schematic operational diagram of the public voltage compensation method according to the first embodiment of the present disclosure.

As shown in FIG. 3, the operation S420, in response to that the compensation effect of the public voltage reaches the preset effect, ending up compensating for the public voltage of the public electrode wire to be compensated includes following operations.

Operation S421, in response to that the compensation effect of the public voltage reaches the preset effect, detecting a working parameter of the first multi-channel operational amplifier OP1 when the display panel is displayed, and determining whether stability of the compensation effect reaches preset stability according to a detected working parameter and a preset working parameter range.

Operation S422, in response to that the stability of the compensation effect reaches the preset stability, ending up compensating for the public voltage of the public electrode wire to be compensated.

In actual implementation, even if the first multi-channel operational amplifier OP1 can meet the public voltage compensation requirements of most public electrode wires, the service life is too short due to an excessive work load. Once the first multi-channel operational amplifier OP1 fails, poor display will reappear, so that the stability of the compensation effect is poor. In the public voltage compensation method of the present disclosure, when the compensation effect reaches the preset effect, a working parameter of the first multi-channel operational amplifier OP1 will be further detected when the display panel is displayed. The working parameter can be one or more combinations of working voltage, working current, and working temperature.

Correspondingly, the preset working parameter range can be one or more combinations of the preset working voltage range, the preset working current range, and the preset working temperature range.

Testers can detect the working parameters when the display is displayed by a special detection circuit, and can compare the working parameters with the preset working parameter range to determine whether the working parameters are in the preset working parameter range. When the working parameters are in the preset working parameter range, determining the stability of the compensation effect of the public voltage reaches the preset stability, and then ending up compensating for the public voltage of the public electrode wire to be compensated.

The operation S420, in response to that the compensation effect of the public voltage reaches the preset effect, ending up compensating for the public voltage of the public electrode wire to be compensated further includes following operations.

Operation S423, in response to that the stability of the compensation effect does not reach the preset stability, installing the second multi-channel operational amplifier OP2, and allowing the second multi-channel operational amplifier OP2 to compensate for the public voltage of the public electrode wire to be compensated, to improve the stability of the compensation effect.

When the working parameters are not in the preset working parameter range, specifically, the working parameters are out of the preset working parameter range, it can be determined that the stability of the compensation effect of the public voltage does not reach the preset stability. In this case, testers can install the second multi-channel operational amplifier OP2, and can design compensation methods to form a public voltage compensation circuit between the second multi-channel operational amplifier OP2 and the public electrode wire to be compensated based on the second multi-channel operational amplifier OP2, so that the first multi-channel operational amplifier OP1 and the second multi-channel operational amplifier OP2 can cooperate to compensate for the public voltage of the public electrode wire to be compensated. In this way, the second multi-channel operational amplifier OP2 can share the larger working load of the first multi-channel operational amplifier OP1, thereby effectively ensuring the service life of the first multi-channel operational amplifier OP1 and the second multi-channel operational amplifier OP2. In this case, not only the compensation effect of the public voltage of the public electrode to be compensated can be further improved, but also the compensation stability can be improved.

The working parameter includes a working temperature.

Although the first multi-channel operational amplifier OP1 includes various working parameters, when the working current and the working voltage exceed the corresponding preset working parameter range, the working temperature will also exceed the preset temperature range. Therefore, the working temperature can be directly used as the working parameter to be detected, to reduce the complexity of the working parameter detection.

Figure 8:
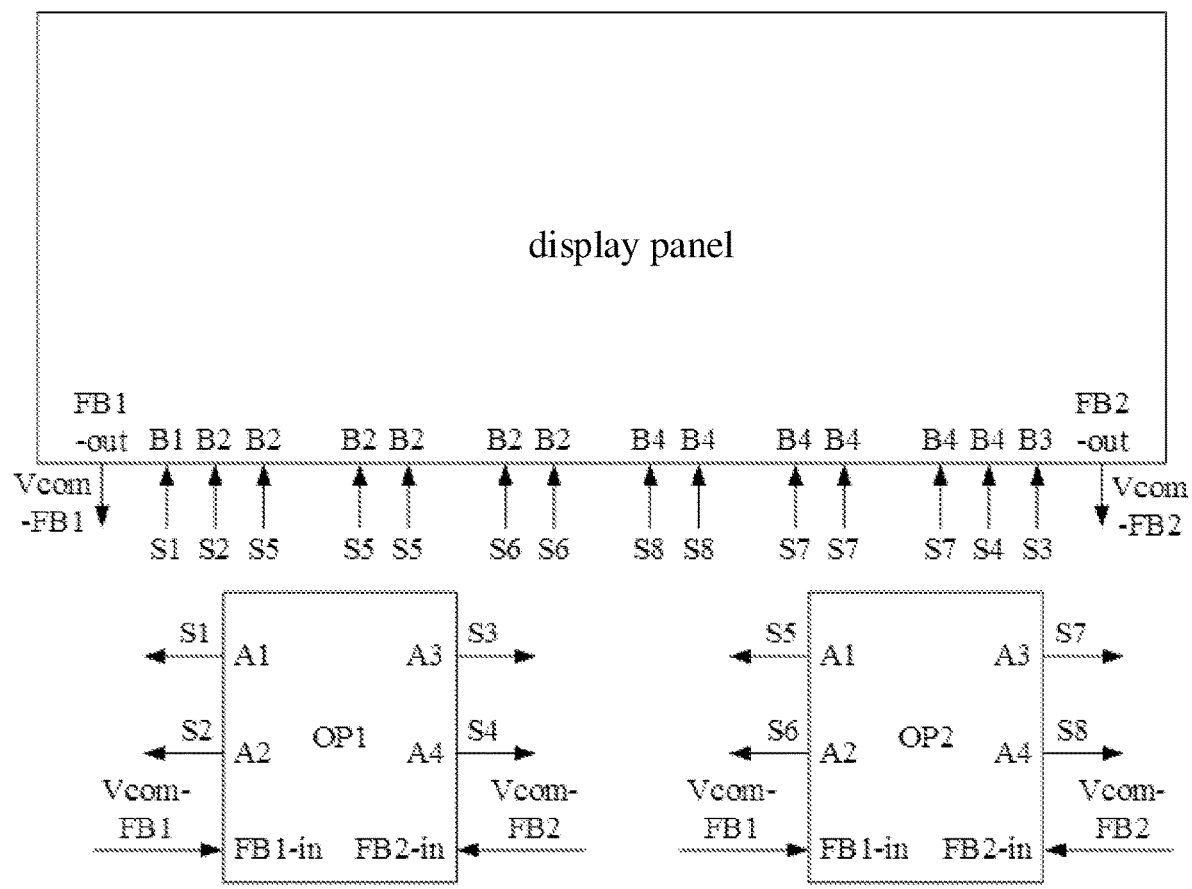
FIG. 8 is yet another circuit schematic diagram of the display module after the display module adopts the public voltage compensation method of the first embodiment according to the second embodiment of the present disclosure.

As shown in FIG. 8, in the first embodiment, the second multi-channel operational amplifier OP2 includes a first feedback input terminal FB1-in, a second feedback input terminal FB2-in, a first compensation output terminal A1, a second compensation output terminal A2, a third compensation output terminal A3, and a fourth compensation output terminal A4.

The allowing the second multi-channel operational amplifier OP2 to compensate for the public voltage of the public electrode wire to be compensated includes:

disconnecting the interconnection among the n second compensation input terminals B2, and disconnecting the interconnection among the n fourth compensation input terminals B4; and connecting the first public voltage feedback output terminal FB1-out of the display panel with the first feedback input terminal FB1-in of the second multi-channel operational amplifier OP2, connecting the second public voltage feedback output terminal FB2-out of the display panel with the second feedback input terminal FB2-in of the second multi-channel operational amplifier OP2, connecting a second compensation input terminals B2 of n−1 second compensation input terminals B2 in a suspended state with the first compensation output terminal A1 of the second multi-channel operational amplifier OP2, connecting b second compensation input terminals B2 of n−1−a second compensation input terminals B2 in the suspended state with the second compensation output terminal A2 of the second multi-channel operational amplifier OP2, connecting c fourth compensation input terminals B4 of n−1 fourth compensation input terminals B4 in the suspended state with the third compensation output terminal A3 of the second multi-channel operational amplifier OP2, and connecting d fourth compensation input terminals B4 of n−1−c fourth compensation input terminals B4 in the suspended state with the fourth compensation output terminal A4 of the second multi-channel operational amplifier OP2.

a, b, c, and d are not less than 1.

In this embodiment, n is not less than 3. Testers can disconnect the circuit board traces between any two adjacent second compensation input terminals B2, or can disassemble the zero-ohm resistor R connected between any two adjacent second compensation input terminals B2, or can turn the switch device T connected between any two adjacent second compensation input terminals B2 off, thereby disconnecting each interconnection among the n second compensation input terminals B2. Similarly, testers can disconnect the circuit board traces between any two adjacent fourth compensation input terminals B4, or can disassemble the zero-ohm resistor R connected between any two adjacent fourth compensation input terminals B4, or can turn the switch device T connected between any two adjacent fourth compensation input terminals B4 off, thereby disconnecting each interconnection among the n fourth compensation input terminals B4.

It can be understood that, after each interconnection among the n second compensation input terminals B2 is disconnected and each interconnection among the n fourth compensation input terminals B4 is disconnected, the number of the second compensation input terminals B2 at the suspended state is n−1. The number of the fourth compensation input terminals B4 at the suspended state is n−1.

In this case, according to traces on the circuit board, the first public voltage feedback output terminal FB1-out of the display panel is connected to the first feedback input terminal FB1-in of the second multi-channel operational amplifier OP2, and the second public voltage feedback output terminal FB2-out of the display panel is connected to the second feedback input terminal FB2-in of the second multi-channel operational amplifier OP2. According to the poor display that exists in the display panel after compensation, a second compensation input terminals B2 of n−1 second compensation input terminals B2 in the suspended state are connected to the first compensation output terminal A1 of the second multi-channel operational amplifier OP2 through traces on the circuit board, and b second compensation input terminals B2 of n−1−a second compensation input terminals B2 in the suspended state are connected to the second compensation output terminal A2 of the second multi-channel operational amplifier OP2 through traces on the circuit board. Further, c fourth compensation input terminals B4 of n−1 fourth compensation input terminals B4 in the suspended state are connected to the third compensation output terminal A3 of the second multi-channel operational amplifier OP2 through traces on the circuit board, and d fourth compensation input terminals B4 of n−1−c fourth compensation input terminals B4 in the suspended state are connected to the fourth compensation output terminal A4 of the second multi-channel operational amplifier OP2 through traces on the circuit board.

In this way, when the display panel is displayed, according to the first public voltage feedback signal Vcom-FB1 received by the second multi-channel operational amplifier OP2, the first compensation output terminal A1 can output the fifth compensation signal S5 to a second compensation input terminals B2, and the second compensation output terminal A2 can output the sixth compensation signal S6 to b second compensation input terminals B2. Further, according to the second public voltage feedback signal Vcom-FB2 received by the second multi-channel operational amplifier OP2, the third compensation output terminal A3 can output the seventh compensation signal S7 to c fourth compensation input terminals B4, and the fourth compensation output terminal A4 can output the eighth compensation signal S8 to d fourth compensation input terminals B4, so that the second multi-channel operational amplifier OP2 can compensate for the voltage of the public electrode wire. In addition, the values of a and b should satisfy the following formula: a+b=n−1, c+d=n−1, to enable each compensation input terminal to access the compensation input signal and improve the compensation effect of the second multi-channel operational amplifier OP2. In order to ensure the applicability of solutions in the present disclosure, n can be 6, both a and c can be 3, and both b and d can be 2.

As shown in FIG. 1, in the first embodiment, the operation S300, interconnecting each of the n second compensation input terminals B2 and interconnecting each of the n fourth compensation input terminals B4 includes:

keeping n−1 first preset devices and n−1 second preset devices in the first state, to make two adjacent second compensation input terminals B2 connected to each other through the first preset device in the first state and make two adjacent fourth compensation input terminals B4 connected to each other through the second preset device in the first state.

The first preset device is a zero-ohm resistor R or a switching device T, and the second preset device is a zero-ohm resistor R or a switching device T.

In actual implementation, due to the increasing product types of display panels, different types of display panels have different sizes and different internal pixel structures, so that in the universal compensation method, the poor display in various types of display panels cannot be eliminated, and the compensation method needs to be adjusted for many times. For example, the larger the size of the display panel, the greater the value of n and the more compensation combinations required during adjustment. In addition, a lot of time needs to be cost during washing and installing the display panel for each adjustment, which is not conducive to large-scale applications. In view of this, in this embodiment, the first state of the zero-ohm resistor R can be the assembly state, and the second state of the zero-ohm resistor R can be the disassembly state. Further, the first state of the switching device T can be the turned-on state, and the second state of the switching device T can be the turned-off state.

Figure 7:
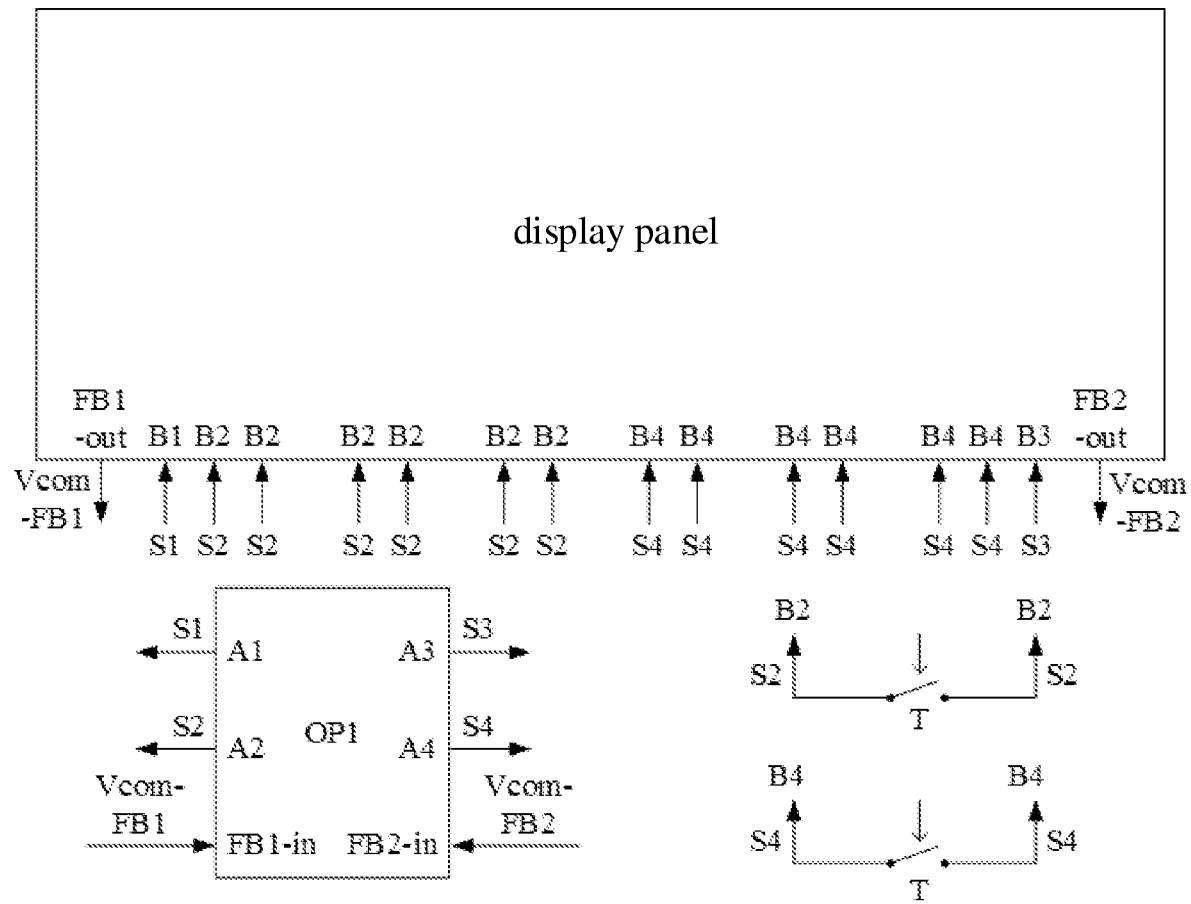
FIG. 7 is another circuit schematic diagram of the display module after the display module adopts the public voltage compensation method of the first embodiment according to the second embodiment of the present disclosure.

In the following, the first preset device and the second preset device are zero-ohm resistors R or switching devices T, which will be used as examples to explain the specific implementation methods of the above two operations. When the first preset device and the second preset device are zero-ohm resistors R, as shown in FIG. 6, operators can install a zero-ohm resistor R between each of the two adjacent second compensation input terminals B2, and install a zero-ohm resistor R between each of the two adjacent fourth compensation input terminals B4. Further, through corresponding traces on the circuit board, operators can connect both terminals of each zero-ohm resistors R with two adjacent second compensation input terminals B2, or with two adjacent fourth compensation input terminals B4, to make the zero-ohm resistors R in the assembly state. In addition, the operator can also disassemble each zero-ohm resistor R to make the zero-ohm resistors R in the disassembly state. When the first preset device and the second preset device are switching devices T, as shown in FIG. 7, the operator can install a switching device T between each of the two adjacent second compensation input terminals B2, and install a switching device T between each of the two adjacent fourth compensation input terminals B4. Further, through corresponding traces on the circuit board, operators can connect the input terminal and the output terminal of the switching device T with two adjacent second compensation input terminals B2, or with two adjacent fourth compensation input terminals B4. A level signal is output to the control terminal of the switching device T, to keep the switching device T in an assembly and turned-on state. Further, another level signal can be output to the control terminal of the switching device T, to make the switching device T in a disassembly and turned-off state. In this embodiment, the switching device T can be a triode, a metal oxide semiconductor tube, an insulated-gate bipolar transistor (IGBT), an optocoupler, and the like, which will not be limited herein.

In this way, testers do not need to wash and install the display panel repeatedly, and only need to assemble or disassemble the zero-ohm resistors R or make the switching devices T turned on/off. Operations for assembling or disassembling the zero-ohm resistors R or making the switching device turned on/off are more convenient and time-saving, which can not only reduce the device cost, but also can save a lot of time.

As shown in FIG. 1, in the first embodiment, before the installing the first multi-channel operational amplifier OP1, the public voltage compensation method further includes when poor display exists in the display panel, installing the first multi-channel operational amplifier OP1.

The existing technology is to directly compensate for the public voltage of the display panel and observe the display effect after compensation. The existing technology ignores partial display panel with good display, that is, no compensation is required in the partial display panel with good display. In this case, it will cost a lot of time and the device cost will increase if the partial display panel with good display is compensated. In the present disclosure, it will be first determined that whether poor display exists in the display panel before compensation. When poor display exists in the display panel, determining the public electrode wire corresponding to the poor display, and installing the first multi-channel operational amplifier OP1 to compensate for each public electrode wire to be compensated. When no poor display exists in the display panel, ending up compensating for the public voltage of the public electrode wire to be compensated. In this way, time and device cost can be reduced since the display panel with good display is not compensated, thereby further reducing time and device cost in the public voltage compensation method.

The Second Embodiment

As shown in FIG. 4 to FIG. 8, the present disclosure further provides a display module for implementing the public voltage compensation method as mentioned above. The specific operations of the public voltage compensation method can be referred to the embodiments as mentioned above. Since the public voltage compensation method adopts all the technical solutions of all the above-mentioned embodiments, the present disclosure will include at least all the beneficial effect in the technical solutions of the above embodiments, which will not be repeated herein.

The display module includes the first multi-channel operational amplifier OP1 and the display panel.

As shown in FIG. 5, the first multi-channel operational amplifier OP1 includes the first feedback input terminal FB1-in, the second feedback input terminal FB2-in, the first compensation output terminal A1, the second compensation output terminal A2, the third compensation output terminal A3, and the fourth compensation output terminal A4. As shown in FIG. 4, the display panel includes the first side edge, the public electrode wire to be compensated, the first preset installation position, the first public voltage feedback output terminal FB1-out, the second public voltage feedback output terminal FB2-out, the first compensation input terminal B1, n second compensation input terminals B2, the third compensation input terminal B3, and n fourth compensation input terminals B4. The first preset installation position is for the first multi-channel operational amplifier OP1 to be installed, and the first compensation input terminal B1 and the n second compensation input terminals B2 are distributed along the direction from the first end of the first side edge to the second end of the first side edge. The first compensation input terminal B1 is provided at a position corresponding to the first end of the first side edge. The third compensation input terminal B3 and the n fourth compensation input terminals B4 are distributed along the direction from the second end of the first side edge to the first end of the first side edge, and the third compensation input terminal B3 is provided at a position corresponding to the second end of the first side edge.

In this embodiment, the display module may include an array substrate with effective the display area and the non-effective display area. The non-effective display area surrounds the periphery of the effective display area. The first side edge can be a side edge of the effective display area. The public electrode wire to be compensated can be placed at the effective display area, and the first preset installation position can be placed at the non-effective display area.

The display module further includes a second multi-channel operational amplifier OP2 which includes a first feedback input terminal FB1-in, a second feedback input terminal FB2-in, a first compensation output terminal A1, a second compensation output terminal A2, a third compensation output terminal A3, and a fourth compensation output terminal A4.

The display panel further includes a second preset installation position for the second multi-channel operational amplifier to be installed.

In this embodiment, the second preset installation position may also be placed at the non-effective display area of the array substrate.

The above-mentioned embodiments are only some embodiments of the present disclosure, and are not intended to limit the scope of the present disclosure. Any equivalent structure conversion made with reference to the description and the accompanying drawings of the present disclosure, directly or indirectly applied in other related technical fields, should all fall in the scope of the present disclosure.

What is claimed is:

1. A public voltage compensation method, applied in a display module comprising a first multi-channel operational amplifier and a display panel, wherein:

the first multi-channel operational amplifier comprises a first feedback input terminal, a second feedback input terminal, a first compensation output terminal, a second compensation output terminal, a third compensation output terminal, and a fourth compensation output terminal;

the display panel comprises a first side edge, a public electrode wire to be compensated, a first public voltage feedback output terminal, a second public voltage feedback output terminal, a first compensation input terminal, n second compensation input terminals, a third compensation input terminal, and n fourth compensation input terminals, the first compensation input terminal and the n second compensation input terminals are distributed along a direction from a first end of the first side edge to a second end of the first side edge, and the first compensation input terminal is provided at a position corresponding to the first end of the first side edge, the third compensation input terminal and the n fourth compensation input terminals are distributed along a direction from the second end of the first side edge to the first end of the first side edge, and the third compensation input terminal is provided at a position corresponding to the second end of the first side edge; and the public voltage compensation method comprises:
installing the first multi-channel operational amplifier;
connecting the first public voltage feedback output terminal of the display panel with the first feedback input terminal of the first multi-channel operational amplifier, connecting the second public voltage feedback output terminal of the display panel with the second feedback input terminal of the first multi-channel operational amplifier, connecting the first compensation input terminal of the display panel with the first compensation output terminal of the first multi-channel operational amplifier, connecting the third compensation input terminal of the display panel with the third compensation output terminal of the first multi-channel operational amplifier, connecting one of the n second compensation input terminals with the second compensation output terminal of the first multi-channel operational amplifier, and connecting one of the n fourth compensation input terminals with the fourth compensation output terminal of the first multi-channel operational amplifier;

interconnecting each of the n second compensation input terminals and interconnecting each of the n fourth compensation input terminals, to allow the first multi-channel operational amplifier to compensate for the public voltage of the public electrode wire to be compensated; and detecting a compensation effect of the public voltage of the public electrode wire to be compensated, and determining whether to end up compensating for the public voltage of the public electrode wire to be compensated according to the compensation effect of the public voltage, n being greater than 1.

2. The public voltage compensation method of claim 1, wherein the detecting the compensation effect of the public voltage of the public electrode wire to be compensated, and determining whether to end up compensating for the public voltage of the public electrode wire to be compensated according to the compensation effect of the public voltage comprises:

detecting a display parameter of the display panel when the display panel is displayed, and determining whether the compensation effect of the public voltage reaches a preset effect according to a detected display parameter and a preset display parameter;

in response to that the compensation effect of the public voltage reaches the preset effect, ending up compensating for the public voltage of the public electrode wire to be compensated; or in response to that the compensation effect of the public voltage does not reach the preset effect, installing a second multi-channel operational amplifier, and allowing the second multi-channel operational amplifier to compensate for the public voltage of the public electrode wire to be compensated, to improve the compensation effect of the public voltage of the public electrode wire to be compensated.

3. The public voltage compensation method of claim 2, wherein the in response to that the compensation effect of the public voltage reaches the preset effect, ending up compensating for the public voltage of the public electrode wire to be compensated comprises:

in response to that the compensation effect of the public voltage reaches the preset effect, detecting a working parameter of the first multi-channel operational amplifier when the display panel is displayed, and determining whether stability of the compensation effect reaches preset stability according to a detected working parameter and a preset working parameter range; and in response to that the stability of the compensation effect reaches the preset stability, ending up compensating for the public voltage of the public electrode wire to be compensated.

4. The public voltage compensation method of claim 3, wherein the in response to that the compensation effect of the public voltage reaches the preset effect, ending up compensating for the public voltage of the public electrode wire to be compensated further comprises:

in response to that the stability of the compensation effect does not reach the preset stability, installing the second multi-channel operational amplifier, and allowing the second multi-channel operational amplifier to compensate for the public voltage of the public electrode wire to be compensated, to improve the stability of the compensation effect.

5. The public voltage compensation method of claim 3, wherein the working parameter comprises a working temperature.

6. The public voltage compensation method of claim 2, wherein:

the second multi-channel operational amplifier comprises a first feedback input terminal, a second feedback input terminal, a first compensation output terminal, a second compensation output terminal, a third compensation output terminal, and a fourth compensation output terminal; and the allowing the second multi-channel operational amplifier to compensate for the public voltage of the public electrode wire to be compensated comprises:

disconnecting the interconnection among the n second compensation input terminals, and disconnecting the interconnection among the n fourth compensation input terminals; and connecting the first public voltage feedback output terminal of the display panel with the first feedback input terminal of the second multi-channel operational amplifier, connecting the second public voltage feedback output terminal of the display panel with the second feedback input terminal of the second multi-channel operational amplifier, connecting a second compensation input terminals of n−1 second compensation input terminals in a suspended state with the first compensation output terminal of the second multi-channel operational amplifier, connecting b second compensation input terminals of n−1−a second compensation input terminals in the suspended state with the second compensation output terminal of the second multi-channel operational amplifier, connecting c fourth compensation input terminals of n−1 fourth compensation input terminals in the suspended state with the third compensation output terminal of the second multi-channel operational amplifier, and connecting d fourth compensation input terminals of n−1−c fourth compensation input terminals in the suspended state with the fourth compensation output terminal of the second multi-channel operational amplifier, the a, the b, the c, and the d being not less than 1.

7. The public voltage compensation method of claim 6, wherein:

the interconnecting each of the n second compensation input terminals and interconnecting each of the n fourth compensation input terminals comprises:

keeping n−1 first preset devices and n−1 second preset devices in a first state, to make two adjacent second compensation input terminals connected to each other through the first preset device in the first state and make two adjacent fourth compensation input terminals connected to each other through the second preset device in the first state; and the disconnecting each interconnection among the n second compensation input terminals, and disconnecting each interconnection among the n fourth compensation input terminals comprises:

keeping n−1 first preset devices and n−1 second preset devices in a second state, to make any one of the n−1 first preset devices disconnect the connection between two adjacent second compensation input terminals which are connected to each other through the first preset device in the first state and make any one of the n−1 second preset devices disconnect the connection between two adjacent fourth compensation input terminals which are connected to each other through the first preset device in the first state, both the first preset device and the second preset device being a zero-ohm resistor or a switching device.

8. The public voltage compensation method of claim 1, wherein before the installing the first multi-channel operational amplifier, the public voltage compensation method further comprises:

determining whether poor display exists in the display panel, and installing the first multi-channel operational amplifier in response to that the poor display exists in the display panel.

9. A display module, for implementing the public voltage compensation method of claim 1, wherein:

the display module comprises the first multi-channel operational amplifier and the display panel;

the first multi-channel operational amplifier comprises the first feedback input terminal, the second feedback input terminal, the first compensation output terminal, the second compensation output terminal, the third compensation output terminal, and the fourth compensation output terminal; and the display panel comprises the first side edge, the public electrode wire to be compensated, the first preset installation position, the first public voltage feedback output terminal, the second public voltage feedback output terminal, the first compensation input terminal, n second compensation input terminals, the third compensation input terminal, and n fourth compensation input terminals, the first preset installation position is for the first multi-channel operational amplifier to be installed, the first compensation input terminal and the n second compensation input terminals are distributed along the direction from the first end of the first side edge to the second end of the first side edge, and the first compensation input terminal is provided at a position corresponding to the first end of the first side edge, the third compensation input terminal and the n fourth compensation input terminals are distributed along the direction from the second end of the first side edge to the first end of the first side edge, and the third compensation input terminal is provided at a position corresponding to the second end of the first side edge.

10. The display module of claim 9, further comprising a second multi-channel operational amplifier comprising a first feedback input terminal, a second feedback input terminal, a first compensation output terminal, a second compensation output terminal, a third compensation output terminal, and a fourth compensation output terminal, wherein the display panel further comprises a second preset installation position for the second multi-channel operational amplifier to be installed.

\* \* \* \* \*